US010678007B2

(12) United States Patent
Van Campenhout et al.

(10) Patent No.: US 10,678,007 B2
(45) Date of Patent: Jun. 9, 2020

(54) ACTIVE-PASSIVE WAVEGUIDE PHOTONIC SYSTEM

(71) Applicants: IMEC VZW, Leuven (BE); Universiteit Gent, Ghent (BE)

(72) Inventors: Joris Van Campenhout, Brussels (BE); Bernardette Kunert, Wilsele (BE); Maria Ioanna Pantouvaki, Kessel-Lo (BE); Dries Van Thourhout, Sint-Amandsberg (BE); Yuting Shi, Ghent (BE)

(73) Assignees: IMEC VZW, Leuven (BE); Universiteit Gent, Ghent (BE)

( * ) Notice: Subject to any disclaimer, the term of this patent is extended or adjusted under 35 U.S.C. 154(b) by 0 days.

(21) Appl. No.: 16/150,898

(22) Filed: Oct. 3, 2018

(65) Prior Publication Data

US 2019/0101711 A1    Apr. 4, 2019

(30) Foreign Application Priority Data

Oct. 4, 2017    (EP) .................................. 17194851

(51) Int. Cl.
*G02B 6/12* (2006.01)
*G02B 6/42* (2006.01)
(Continued)

(52) U.S. Cl.
CPC ............. *G02B 6/425* (2013.01); *G02B 6/13* (2013.01); *G02B 6/4203* (2013.01); *H01S 5/021* (2013.01);
(Continued)

(58) Field of Classification Search
USPC ......................................................... 385/14
See application file for complete search history.

(56) References Cited

U.S. PATENT DOCUMENTS

| | | | |
|---|---|---|---|
| 2003/0003737 A1* | 1/2003 | Delwala ............... | G02B 6/1225 438/689 |
| 2008/0138008 A1* | 6/2008 | Tolstikhin ............ | G02B 6/1228 385/14 |

(Continued)

FOREIGN PATENT DOCUMENTS

EP    2866317 A1    4/2015

OTHER PUBLICATIONS

European Search Report, European Patent Application No. 17194851. 6, dated Apr. 5, 2018, 7 pages.

(Continued)

*Primary Examiner* — Eric Wong
(74) *Attorney, Agent, or Firm* — McDonnell Boehnen Hulbert & Berghoff LLP

(57) ABSTRACT

Example embodiments relate to active-passive waveguide photonic systems. An example embodiment includes a monolithic integrated active/passive waveguide photonic system. The system includes a substrate having positioned thereon at least one active waveguide and at least one passive waveguide. The at least one active waveguide and the at least one passive waveguide are monolithically integrated and are arranged for evanescent wave coupling between the waveguides. The at least one active waveguide and the at least one passive waveguide are positioned so that at least a portion of each waveguide does not overlap the other waveguide, both in a height direction and in a lateral direction with respect to the substrate.

20 Claims, 13 Drawing Sheets

(51) Int. Cl.
  *G02B 6/13* (2006.01)
  *H01S 5/02* (2006.01)
  *H01S 5/026* (2006.01)
  *H01S 5/10* (2006.01)
(52) U.S. Cl.
  CPC ............ *H01S 5/026* (2013.01); *H01S 5/0262* (2013.01); *H01S 5/0265* (2013.01); *H01S 5/1032* (2013.01); *G02B 2006/12035* (2013.01); *G02B 2006/12083* (2013.01)

(56) References Cited

U.S. PATENT DOCUMENTS

| | | | |
|---|---|---|---|
| 2009/0116522 A1* | 5/2009 | Watson | H01S 5/12 372/38.01 |
| 2012/0320939 A1* | 12/2012 | Baets | B82Y 20/00 372/45.01 |
| 2013/0136392 A1* | 5/2013 | Huo | G02B 6/12 385/14 |
| 2014/0153600 A1 | 6/2014 | Luo et al. | |
| 2018/0183212 A1* | 6/2018 | Van Campenhout | H01S 5/34306 |
| 2019/0219846 A1* | 7/2019 | Van Campenhout | G02B 6/131 |

OTHER PUBLICATIONS

Kunert, Bernardette et al., "III/V Integration on Silicon Substrates by Selective Area Growth", IMEC, 2016, 39 pages.
GCCCG-1/DKT2016, 1st German Czechoslovak Conference on Crystal Growth, Mar. 16-18, 2016, Dresden, Germany, 15 pages.
Kunert, B. et al., "Integraton of III/V Hetero-Structures by Selective Area Growth on Si for Nano- and Optoelectronics", ECS Transactions, vol. 75, No. 8, 2016, pp. 409-419.

* cited by examiner

ACTIVE-PASSIVE WAVEGUIDE PHOTONIC SYSTEM

CROSS-REFERENCE TO RELATED APPLICATIONS

The present application is a non-provisional patent application claiming priority to European Patent Application No. EP 17194851.6, filed Oct. 4, 2017, the contents of which are hereby incorporated by reference.

FIELD OF THE DISCLOSURE

The present disclosure relates to photonic systems. More particularly, the present disclosure relates to monolithic integrated active/passive waveguide photonic systems as well as methods for obtaining such photonic systems.

BACKGROUND

Photonics systems are widespread and can be used for implementing optical or electro-optical functionalities in a compact manner. One potential photonics system targeting tele- and datacom, as well as optical sensing, is based on silicon. Silicon photonics leverages the CMOS manufacturing infrastructure to realize photonic integrated circuits, typically using indirect bandgap group-IV semiconductor materials to realize passive waveguide functionality as well as active electro-optical functionality such as light modulation and light detection.

For applications using light generation and light amplification, and to a lesser extent also high-performance light modulation and absorption, direct bandgap III-V material waveguides may be used to realize such active functionalities. Nevertheless the manufacturing and integration of high-quality III-V semiconductor material waveguides on the silicon photonics platform is challenging and cumbersome. Although a number of attempts have been made in the past, there is no appropriate solution available yet.

SUMMARY

Some embodiments provide a monolithic integrated passive/active waveguide photonics system as well as a method for manufacturing such a photonic system. In some embodiments, the monolithic integrated passive waveguide may be a silicon waveguide and the active waveguide may be a III-V semiconductor waveguide.

The above objective is accomplished by a method and system according to example embodiments.

Example embodiments relate to a monolithic integrated active/passive waveguide photonic system, the system comprising
  a substrate with positioned thereon at least one active waveguide and at least one passive waveguide, the active waveguide and passive waveguide being monolithic integrated and being arranged for evanescent wave coupling between the waveguides, each of the active waveguide and the passive waveguide being positioned so it does at least partly not overlap with the other waveguide both in height direction as in lateral direction with respect to the substrate.

In some embodiments, lateral displacement of the passive waveguide with respect to the III-V waveguide can be provided thus preventing impact of the defective active to passive growth interface on the propagation losses of the passive waveguide. In some embodiments, vertical displacement of the passive waveguide with respect to the active waveguide is provided to minimize any impact of the topography induced by the presence of the passive waveguide during the epitaxial growth process of the active material.

In some embodiments, efficient coupling between active and passive waveguides can be obtained in a photonics system, whereby the active and passive waveguides are monolithically integrated. The active waveguide may be a III-V waveguide and the passive waveguide may be a silicon or silicon nitride waveguide.

Some embodiments combine active, direct bandgap III-V material based structures showing better light generation and absorption efficiencies, and passive crystal silicon structures showing low losses on a single platform. In some embodiments, active III-V material can be directly and selectively grown on a patterned silicon substrate.

In some embodiments, the passive waveguide which is part of an active/passive monolithic integrated structure can be manufactured at the same time as passive waveguides being part of a passive device integrated on the photonics system.

In some embodiments, active multiple quantum wells or quantum dots are incorporated into the III-V semiconductor waveguide cores, resulting in an overlap of the well-confined mode field and the active region, such that efficient optical gain or optical absorption can be achieved. In particular embodiments, the III-V semiconductor waveguides and quantum wells contained therein are made from semiconductor materials, such as GaAs and InGaAs.

In some embodiments, the III-V semiconductor waveguides are selectively grown as nanoridge structures. Where reference is made to a nanoridge structure, reference is made to a structure having a narrow supporting base with a freestanding wider body portion on top, whereby at least one dimension of the smaller body portion has a nano-size dimension. It may in one example consist of a supporting III-V semiconductor bottom fin portion grown inside nano-confined trenches and a freestanding body portion on top of the trench pattern with increased III-V semiconductor volume. The III-V semiconductor growth inside narrow trenches (bottom fin) with an aspect ratio larger than 1 guarantees an efficient trapping filter for misfit and threading dislocation defects, so that the out-grown material (freestanding body) on top of the trench pattern is free of defects. The growth out of the trench can be manipulated to form a nanoridge with different shapes, which are vertically and laterally broadened with respect to the bottom fin to enable efficient wave guidance. The nanoridge shape may be triangular, box-like, diamond-like or ridge-like cross-section with a hat-like or a flat top surface.

In some embodiments, the III-V semiconductor nanoridge waveguides are seeded on the {111} facets of a V-shaped silicon surface as the {111} facets of the silicon surface exclude the presence of antiphase boundaries. Alternatively the deposition can also be made on a flat {001} silicon surface. The trench side walls can in such embodiments also trap anti phase boundaries.

A coupling structure may be provided for coupling radiation between the at least one active waveguide and the at least one passive waveguide, the coupling structure being adapted for coupling radiation such that it does not travel in the edge portions of the nanoridge waveguide.

In another aspect, the present disclosure relates to a photonic system comprising a monolithic integrated active waveguide integrated in a silicon or silicon nitride based photonic system, the system comprising a substrate with at least one active waveguide, such as for example a III-V waveguide.

In another embodiment, a p-i-n junction is embedded in the III-V semiconductor waveguide to enable carrier injection and population inversion in the embedded quantum wells or quantum dots upon forward biasing the diode, to achieve optical gain in the active waveguide. In another embodiment, a p-i-n junction is embedded in the III-V semiconductor waveguide to enable extraction of photo-generated carriers from the embedded quantum wells or quantum dots upon reverse biasing the diode, to achieve photodetection in the active waveguide. In yet another embodiment, a p-i-n junction is embedded in the III-V semiconductor waveguide to enable strong electric field modulation in the embedded quantum wells or quantum dots upon reverse biasing the diode, to achieve optical absorption modulation in the active waveguide, based on electro-optical effects in III-V semiconductor materials such as the Franz-Keldish or Quantum-Confined Stark Effect.

According to example embodiments, low resistance contacts causing no significant optical excess loss are provided for the active III-V waveguide. The contacts comprise at least one of, e.g., both of, a bottom n-type contact from n+ implanted silicon fin and a top p-type contact implemented in an in-situ p+ doped, low bandgap III-V material fin. Alternatively, the contacts comprise at least one of, e.g., both of, a bottom p-type contact and a top n-type contact.

Contacts may be provided for the active III-V semiconductor waveguide, the contacts being a bottom n-type contact fin from n+ implanted silicon and/or a top p-type contact implemented in an in-situ p+ doped, low bandgap III-V semiconductor fin, or the contacts being a bottom p-type contact and a top n-type contact.

The photonic system may comprise any of a semiconductor optical amplifier, a laser diode, an electro-absorption modulator, a photodetector or an optical transceiver.

At least part of the evanescent wave coupling may occur between non-overlapping portions of the active and passive waveguide.

The at least partly not overlapping portions of the waveguides between which evanescent wave coupling occurs may be portions of the waveguides where the waveguides are parallel to each other.

The active waveguide and passive waveguide may be not overlapping, i.e. having no overlapping portions, both in height direction as in lateral direction with respect to the substrate.

In still another aspect, the present disclosure relates to an active/passive waveguide photonic system, the system comprising a substrate with positioned thereon at least one active waveguide and at least one passive waveguide, wherein a coupling structure is provided for coupling radiation between the at least one active waveguide, e.g. III-V semiconductor waveguide, and the at least one passive waveguide, the coupling structure being implemented such that radiation couples from the passive to active waveguides or vice versa, without traveling in the end portions of the active III-V semiconductor waveguide.

In still another aspect, the present disclosure relates to a method for manufacturing a monolithic integrated active/passive waveguide photonic system, the method comprising the steps of providing a substrate, and monolithically integrating on the substrate an active waveguide and a passive waveguide, wherein the monolithically integrating comprises integrating the waveguides such that evanescent wave coupling between the waveguides is obtained, the integrating being such that each of the active waveguide and the passive waveguide being positioned so it does at least partly not overlap with the other waveguide both in height direction as in lateral direction with respect to the substrate.

The active waveguide may be a III-V semiconductor waveguide and/or the passive waveguide may be any of a silicon or silicon nitride waveguide.

Integrating may comprise fabricating active III-V nanoridge waveguides comprising each a freestanding body portion and a supporting bottom fin portion, whereby the freestanding body portion is characterized by that part of the nanoridge waveguide which is growing out vertically and laterally from the supporting bottom fin portion of the nanoridge waveguide, the supporting bottom fin portion being in contact with the substrate.

The integrating may comprise fabricating passive Si photonics structures.

The integrating may comprise providing a radiation coupler between at least one active III-V nanoridge waveguide and at least one passive Si waveguide, the underlying passive Si waveguide being offset vertically towards the substrate with respect to the freestanding body portion of the active III-V nanoridge waveguide.

The at least one active III-V nanoridge waveguide may comprise at least one heterojunction forming a quantum well or quantum dot inside their active region.

The active III-V nanoridge waveguides may be made from GaAs and the quantum wells are made from InGaAs.

The active III-V nanoridge waveguides may be grown on a patterned silicon substrate.

The active III-V nanoridge waveguides may be grown monolithic in narrow trenches with widths ranging from 20 nm to 500 nm and with heights ranging from 100 nm to 500 nm.

The growth of active III-V nanoridge waveguides may be seeded on the {111} facets of a V-shaped Si surface.

The active III-V nanoridge waveguides may be grown by any of metal organic vapor phase epitaxy, molecular beam epitaxy or hybrid vapor phase epitaxy.

The freestanding body portion of the III-V nanoridges may be passivated by a wrapping layer.

The passivation layer may be made in InGaP.

The active III-V nanoridge waveguides may have a n+-doped, Si fin as bottom contact, and have a p+-doped, low-bandgap III-V contact fin attached to their top surface, or in which the active III-V nanoridge waveguides have a p+doped bottom contact and an n+ top contact.

A coupler between at least one active III-V nanoridge waveguide and at least one underlying passive Si waveguide may be provided by at least one phase-matched evanescent coupler.

The at least one phase-matched evanescent coupler may have a length and a gap that combined together maximize the amount of coupled radiation.

The at least one evanescent directional coupler may be placed in such a way as to have substantially no light propagation in the end portions of the III-V nanoridge waveguides.

Integrating the active and passive waveguide may comprise integrating the active and passive waveguide such that at least part of the evanescent wave coupling occurs between non-overlapping portions of the active and passive waveguide and/or integrating the active and passive waveguide such that the active and passive waveguide are not overlapping both in height direction as in lateral direction with respect to the substrate. The at least partly not overlapping portions of the waveguides between which evanescent wave coupling occurs may be portions of the waveguides where the waveguides are parallel to each other.

Particular aspects are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved, certain objects have been described herein above. Of course, it is to be understood that not necessarily all such objects may be achieved in accordance with any particular embodiment. Thus, for example, it is understood that the invention may be embodied or carried out in a manner that achieves one advantage or group of advantages as taught herein without necessarily achieving other objects or advantages as may be taught or suggested herein.

The above and other aspects will be apparent from and elucidated with reference to the embodiment(s) described hereinafter.

BRIEF DESCRIPTION OF THE DRAWINGS

Embodiments will now be described further, by way of example, with reference to the accompanying drawings, in which.

Figure 1:
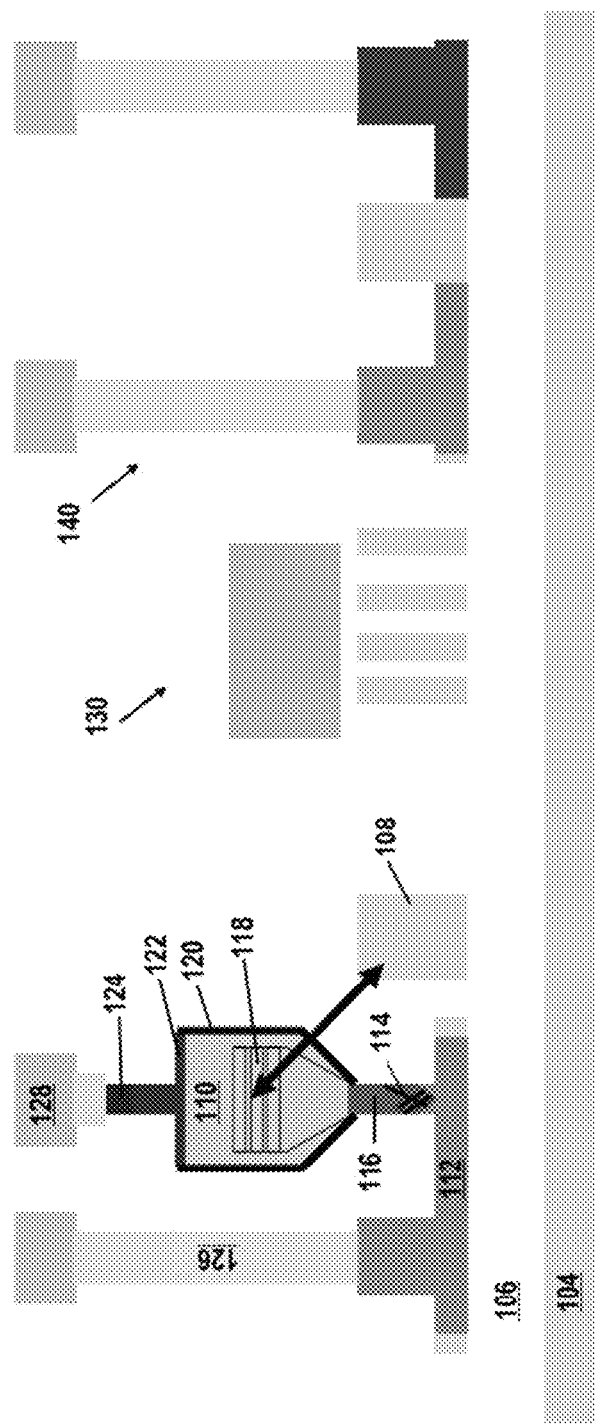
FIG. 1 illustrates a monolithic passive/active waveguide photonics system, according to example embodiments.

The drawings are only schematic and are non-limiting. In the drawings, the size of some of the elements may be exaggerated and not drawn on scale for illustrative purposes. The dimensions and the relative dimensions do not necessarily correspond to actual reductions to practice.

Any reference signs in the claims shall not be construed as limiting the scope.

In the different drawings, the same reference signs refer to the same or analogous elements.

DETAILED DESCRIPTION

The present disclosure will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, directional terminology such as top, bottom, front, back, leading, trailing, under, over and the like in the description and the claims is used for descriptive purposes with reference to the orientation of the drawings being described, and not necessarily for describing relative positions. Because components of embodiments can be positioned in a number of different orientations, the directional terminology is used for purposes of illustration only, and is in no way intended to be limiting, unless otherwise indicated. It is, hence, to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that more features than are expressly recited in each claim are required. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects should not be taken to imply that the terminology is being re-defined herein to be restricted to include any specific characteristics of the features or aspects with which that terminology is associated.

In the description provided herein, numerous specific details are set forth. However, it is understood that embodiments may be practiced without these specific details. In other instances, conventional methods, structures and techniques have not been shown in detail in order not to obscure an understanding of this description.

Where reference is made to monolithic integration, reference is made to integration of components directly on a single base material (substrate), using wafer-scale processes including—but not limited to—(epitaxial) deposition, lithography, etching, chemical-mechanical polishing.

Where, in embodiments, reference is made to a height direction, reference is made a distance to the basic semiconductor layer of the substrate in a direction perpendicular to the substrate. Where, in embodiments, reference is made to a lateral direction, reference is made to a position in a plane parallel to the substrate, the substrate typically being a flat substrate. In a first aspect, the present disclosure relates to a monolithic integrated active/passive waveguide photonic system. The system according to example embodiments may include a substrate with at least one active waveguide, such as for example a III-V waveguide, and at least one passive waveguide, such as for example a silicon waveguide, positioned thereon. According to example embodiments, the active waveguide and passive waveguide are monolithic integrated and are arranged for evanescent wave coupling between the waveguides, each of the active waveguide and the passive waveguide being positioned so it does at least partly not overlap with the other waveguide both in height direction as in lateral direction with respect to the substrate. At least part of the evanescent wave coupling, but possibly all of the evanescent wave coupling, occurs between non-overlapping portions of the active and passive waveguide. According to some embodiments, the projection of the waveguides in a direction perpendicular to the substrate and in directions parallel to the substrate even do not overlap. By positioning the active waveguide and the passive waveguide as indicated, these can be made in different layers on the substrate, and at different lateral positions on the substrate, this allows to integrate both waveguides monolithic as well as to position them sufficiently close to each other to allow strong evanescent waveguide coupling between both waveguides. The at least partly not overlapping portions of the waveguides between which evanescent wave coupling occurs may be portions of the waveguides where the waveguides are parallel to each other (along their length direction).

In example embodiments, the substrate used as a starting substrate may be a semiconductor substrate or a semiconductor-on-insulator substrate, such as for example a silicon-on-insulator substrate, although embodiments are not limited thereto. The semiconductor substrate may be SOI, Si, Ge, SiGe, etc.

In some embodiments, the passive waveguide may be a silicon passive waveguide. Hence, in some embodiments, the silicon passive waveguide of the active/passive structure can be made using the same processing steps as further silicon waveguides that may be present in the silicon photonics platform, such as for example in Si/SiN passive devices and Si active devices using carrier depletion or carrier injection in Si p-n junctions. It nevertheless is to be noted that the passive waveguide is not limited to silicon and that alternatively also other passive waveguides could be used, such as for example GeSi or germanium waveguides.

In some embodiments, the active waveguide may be a III-V semiconductor active waveguide, such as for example GaAs waveguides with InGaAs quantum wells, InAs and InGaAs quantum dots, InGaAs/GaSbAs transitions, InGaNAs quantum wells, or for example InP waveguides with InGaAs quantum wells InGaAsP quantum wells, InAs quantum dots, AlGaInAs quantum wells, or for example InAs with InGaSbAs quantum wells and GaSb with InGaSbAs quantum wells. The quantum wells and quantum dots thereby are strained to the lattice constant of the waveguide material. Depending on the materials used, specific wavelength ranges can be used in the photonics device, as shown in Table 1. The III-V semiconductor waveguides may be implemented as nanoridges.

TABLE I

| possible III-V materials | | |
|---|---|---|
| III-V semiconductor waveguide | Active material (providing optical gain) | Emission wavelength |
| GaAs | InGaAs quantum wells: In content >25% | 1120 nm~1350 nm |
| | InAs quantum dots | 1120 nm~1350 nm |
| | InGaAs/GaSbAs type II transition | 1120 nm~1400 nm |
| | InGaNAs quantum wells: dilute nitrides | 1250 nm~1600 nm |

TABLE I-continued possible III-V materials

| III-V semiconductor waveguide | Active material (providing optical gain) | Emission wavelength |
|---|---|---|
| InP or InGaAs | InGaAs quantum wells: In content >30% | 1250 nm~1600 nm |
| | InGaAsP quantum wells | 1250 nm~1700 nm |
| | InAs quantum dots | 1250 nm~1700 nm |
| | AlGaInAs quantum wells | 1250 nm~1700 nm |
| InAs | InGaSbAs - different composition in barrier and quantum well | 1550 nm~5000 nm |
| GaSb | InGaSbAs - different composition in barrier and quantum well | 1550 nm~5000 nm |

By way of illustration, embodiments not being limited thereby, an example of a photonics integrated system comprising an active-passive waveguide device is shown in FIG. 1. In FIG. 1, a schematic cross section of the photonics integrated system is described wherein an active III-V semiconductor waveguide is monolithically co-integrated with passive and active silicon/silicon-nitride waveguide devices. The III-V/silicon semiconductor device is such that both waveguides are formed directly on a single silicon layer. The structure according to the particular example comprises a SOI substrate comprising a silicon substrate 104 covered with a buried oxide layer (BOx) 106 and top silicon layer.

A passive waveguide 108 is integrated on top of the buried oxide layer (BOx), in the present example being a passive silicon coupling waveguide 108.

At a different position on the substrate but close to the passive silicon coupling waveguide 108, a III-V waveguide 110 is formed. In the present example, the III-V waveguide 110 is grown on a N+ doped GaAs layer 116 comprising crystal defects 114, itself grown on a N+ doped silicon layer 112 acting as a bottom contact in n+ implanted silicon fin on the substrate 102. The N+ Si and N+ GaAs regions form the n-type electrode of the III-V semiconductor p-i-n diode. The III-V waveguide 110 in the present case is a non-intentionally doped (intrinsic) GaAs waveguide comprising one or more InGaAs quantum wells 118. The III-V waveguide 110 furthermore comprises a passivation layer 120, in the present example being an InGaP layer. In the present example, the III-V waveguide also comprises, at the top side of the III-V waveguide, a GaAs layer 122 as well as a P+ doped GaAs layer 124, acting as the p-side electrode of the III-V semiconductor p-i-n diode. This top electrode is a p-type contact implemented as in-situ p+ doped, low-bandgap III-V contact fin. Based on the above description employing a top and bottom contact implemented as narrow fins, low resistance contacts are provided, causing no significant optical excess loss to the III-V waveguide.

The position of the active waveguide and the passive waveguide allow both co-integration of the waveguides as well as efficient evanescent coupling between the active waveguide and the passive waveguide.

In the system, the different active and active/passive devices are at the upper side provided with contact plugs 126, as well as metal interconnects 128, e.g. Cu, for contacting the device.

At other positions on the substrate, also other devices both active silicon devices 140 and passive silicon devices 130 may be present. The passive device is in the present example a Si/SiN passive device. The active device may be a Si p-(i)-n carrier injection or carrier depletion device.

By way of illustration, the particular example not being limited to the specific sizes mentioned, Table 2 illustrates possible dimensions of the different elements of the active-passive device in the photonics system.

TABLE 2

| Height silicon waveguide | 100 nm-500 nm |
| Width silicon waveguide | 100 nm-1000 nm |
| Lateral spacing between GaAs waveguide and silicon waveguide | 50 nm-500 nm |
| Width N+ GaAs | 20 nm-100 nm |
| Height N+ GaAs | 100 nm-400 nm |
| Height GaAs waveguide | 200 nm-1000 nm |
| Width GaAs waveguide | 50 nm-500 nm |
| Width GaAs top layer | 200 nm-600 nm |
| Height top electrode | 100 nm-500 nm |
| Width doped GaAs(+) layer | 20 nm-100 nm |

Figure 2:
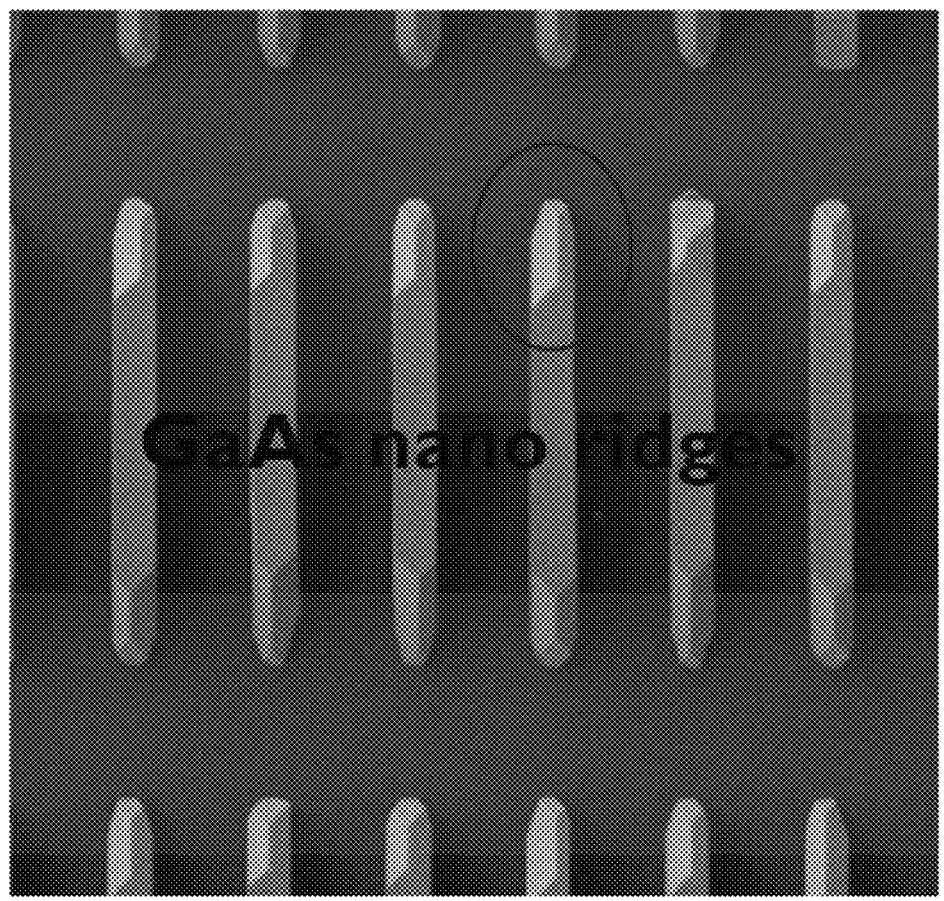
FIG. 2 illustrates III-V semiconductor active nanoridge waveguides, as can be used in a photonics system according to example embodiments.
Figure 3:
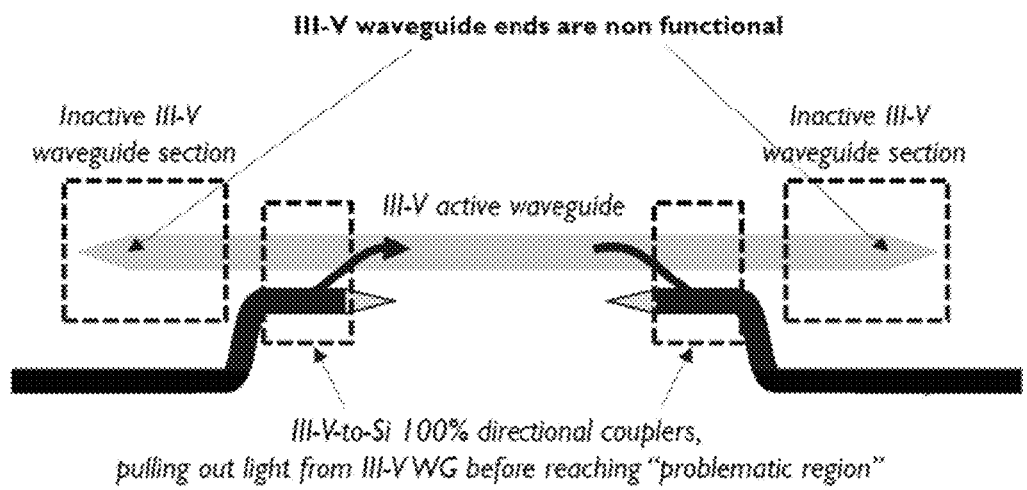
FIG. 3 illustrates radiation coupling between passive Si and active III-V semiconductor waveguides, as can be used in a photonics system according to example embodiments.

In some embodiments, the III-V waveguides are implemented as nanoridges. By way of illustration FIG. 2 illustrates such nanoridges in top view. These nanoridges illustrate a clear facet formation at the waveguide end. The end portions of the waveguide (over a few microns) also may be more defective. According to some embodiments, in order to avoid wave propagation through the ends of the III-V semiconductor waveguides, evanescent wave couplers are used to couple light between the Si and III-V waveguide in such a configuration to prevent light from propagating in the end portions of the III-V waveguide, and thus making these ends non-functional. This may be referred to as inside-coupled waveguide devices, since the coupling occurs in the region outside the end portions, i.e. in the body portion of the waveguide. By way of illustration, embodiments not being limited thereto, a schematic overview of the coupling is shown in FIG. 3. Where reference is made to the end portions of the nanoridge waveguide, reference is made to the outer ends along the longitudinal directions of the longitudinal nanoridge waveguides.

Further by way of illustration, embodiments not being limited thereby, the photonics systems may be for use in different optical or electro-optical devices.

The photonic system may in one embodiment comprise a semiconductor optical amplifier comprising a III-V semiconductor nanoridge gain waveguide coupled to passive waveguides using 100% evanescent couplers.

The photonic system may in another embodiment be for use in a laser diode. The photonic system may then comprise a semiconductor optical amplifier, e.g. as described above, with optical gain provide by the forward-biased III-V semiconductor p-i-n waveguide and optical feedback provided by optical mirrors implemented in the III-V semiconductor waveguide or in the passive waveguide(s), e.g. silicon waveguide(s).

The photonic system may in yet another embodiment be an electro-absorption modulator, comprising for example a reverse-biased III-V semiconductor p-i-n absorption waveguide coupled to a passive waveguide, e.g. a silicon waveguide, using 100% evanescent couplers.

The photonic system may in still another embodiment be a photodetector comprising for example a reverse-biased III-V semiconductor p-i-n absorption waveguide coupled to a passive waveguide, e.g. a silicon waveguide, using 100% evanescent couplers.

The photonic system may in yet another embodiment be an optical transceiver implementation wherein co-integration is obtained of a laser diode, an electro-absorption modulator, a semiconductor optical amplifier and a photodetector with individually optimized III-V gain/absorption properties and interconnected through passive and active waveguide devices, e.g. silicon waveguide devices.

Figure 4:
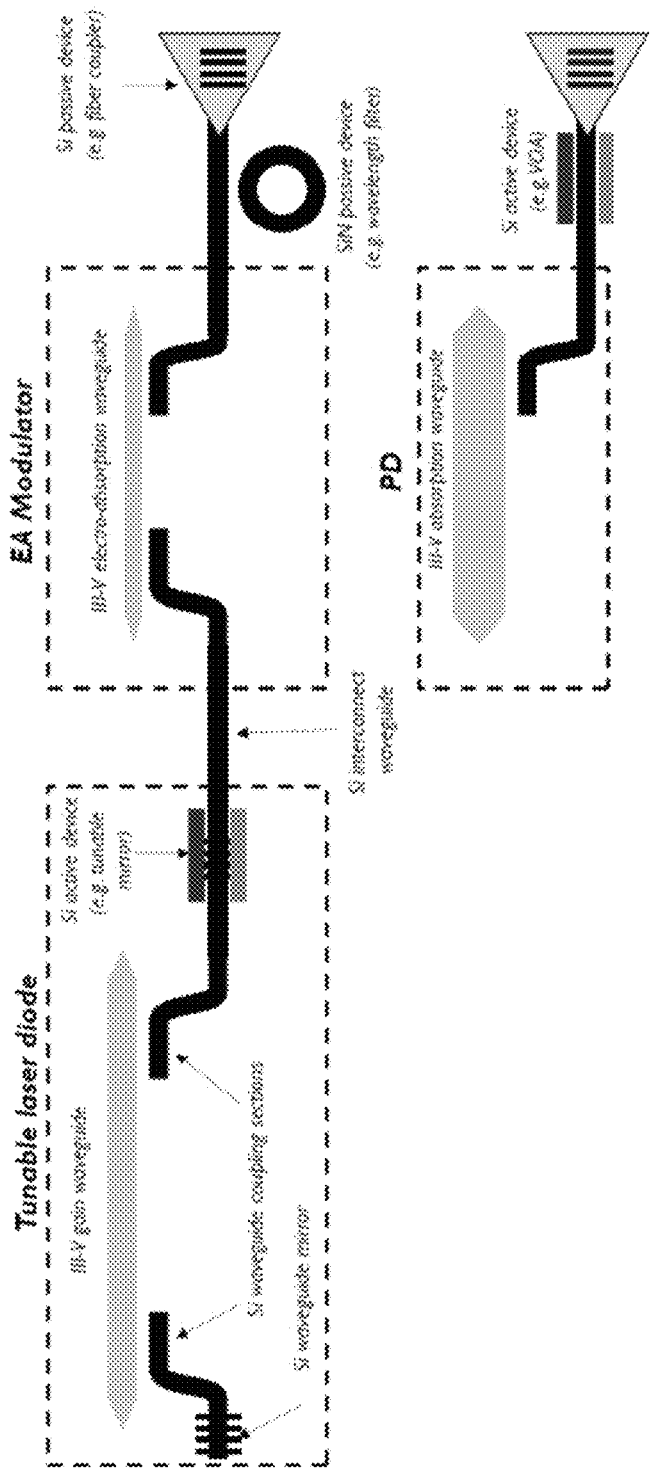
FIG. 4 illustrates a photonics system comprising a tunable laser diode and an electro absorption modulator and a photodetector, according to example embodiments.

By way of illustration, embodiments not being limited thereto, a photonics system comprising a tunable laser diode and an electro absorption modulator is schematically shown in FIG. 4. According to the example shown, the photonics system also comprises a photodetector.

In another aspect, the present disclosure relates to a photonic system comprising a monolithic integrated active waveguide integrated in a silicon or silicon nitride based photonic system, the system comprising a substrate with at least one active waveguide, such as for example a III-V semiconductor waveguide. According to some embodiments, low resistance contacts causing no significant optical excess loss are provided for the active II-V semiconductor waveguide. The contacts include at least one of, e.g., both of, a bottom n-type contact from a n+ doped silicon fin structure and a top p-type contact implemented in a p+ doped, low bandgap III-V semiconductor fin structure. Alternatively, the contacts comprise at least one of, e.g., both of, a bottom p-type contact and a top n-contact. Further features may be as set out in the first aspect.

In still another aspect, the present disclosure relates to an active/passive waveguide photonic system, the system comprising a substrate with positioned thereon at least one active waveguide and at least one passive waveguide, wherein a coupling structure is provided for coupling radiation between the at least one active III-V semiconductor waveguide and the at least one passive waveguide, the coupling structure being adapted for coupling radiation such that it does not travel in the end portions of the III-V semiconductor waveguide. Where reference is made to the end portions of the III-V semiconductor waveguide, reference is made to the outer ends along the longitudinal direction of the III-V semiconductor waveguides. Further features may be as set out in the first aspect.

In a further aspect, the present disclosure relates to a method for manufacturing a monolithic integrated active/passive waveguide photonic system. The method may be especially suitable for manufacturing a system as described in the first aspect. The method comprises the steps of providing a substrate and monolithically integrating on the substrate an active waveguide and a passive waveguide. The monolithic integration comprises integrating the passive waveguide and active waveguide such that strong evanescent wave coupling between the waveguides is obtained, the integrating being such that each of the active waveguide and the passive waveguide being positioned so it does at least partly not overlap with the other waveguide both in height direction as in lateral direction with respect to the substrate. In embodiments the active waveguide may be a III-V waveguide and the passive waveguide may be any of a silicon or silicon nitride waveguide.

The method may comprise the step of integrating the passive and active waveguide such that, in operation, at least part of the evanescent wave coupling, but possibly all of the evanescent wave coupling, occurs between non-overlapping portions of the active and passive waveguide. The method may comprise the step of integrating the passive and active waveguide such that the at least partly not overlapping portions of the waveguides between which evanescent wave coupling occurs may be portions of the waveguides where the waveguides are parallel to each other (along their length direction).

Figure 5:
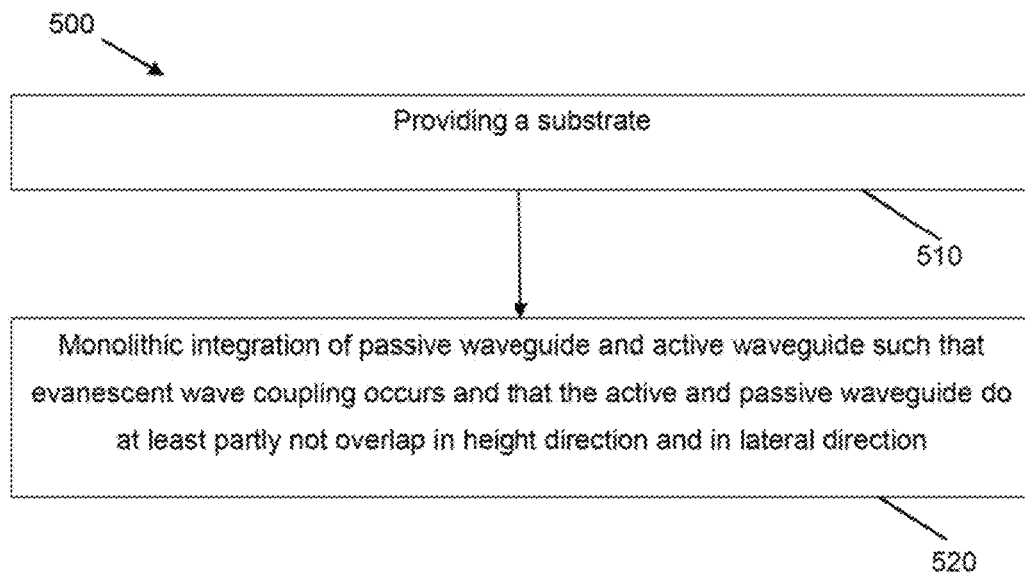
FIG. 5 illustrates a schematic overview of a method, according to example embodiments.

An overview of the different steps is shown in FIG. 5. The method 500 is shown, with the step 510 of providing a substrate and the step 520 of monolithically integrating the passive and active waveguide in their specific configuration.

By way of illustration, embodiments not being limited thereto, an example method of fabrication is described with reference to FIG. 6 to FIG. 20, illustrating different steps in more detail. Nevertheless, multiple additional processing steps may be inserted alternatively or some processing steps may be skipped, for example in order to achieve a coupling between an active direct bandgap III-V semiconductor nanoridge waveguides and passive silicon waveguides monolithic integrated in an integrated photonic circuits and devices. The method is illustrated with reference to a silicon photonics system. It should be understood that embodiments are not limited thereto.

In a first step monocrystalline silicon or silicon nitride layers are patterned to define a plurality of passive waveguide structures. These passive waveguide structures may be the basis for more complex photonic devices, such as Mach-Zehnder interferometers, splitters and combiners, microring resonators, waveguide cavities, grating couplers, tapers, or may even be part of active silicon devices after supplementary processing steps, such as integrated heaters, modulators, photodiodes, phase-shifters, etc. The silicon or silicon nitride structures formed based in the silicon or silicon nitride layer are part of the active/passive waveguide structure, and may be part of a passive silicon device or an active silicon device.

Figure 6:
FIG. 6 illustrates a step in the production of a photonics system, according to example embodiments.
Figure 7:
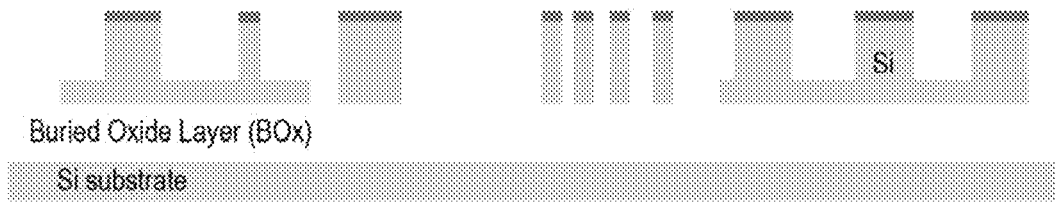
FIG. 7 illustrates a step in the production of a photonics system, according to example embodiments.

The process can be started from a silicon on insulator substrate. In other embodiments, silicon nitride can be deposited using CVD processing on top of an underlying buried silicon oxide layer and may be 200 nm to 600 nm thick. Other passive layers for patterning are also possible. The patterning step defining the waveguide structures includes the exposure of a photosensitive mask, its development, and a chemical etch step, which together form a lithographic patterning step to selectively open areas in the substrate layer. In some embodiments, this lithographic patterning step is repeated, so as to obtain defined waveguide structures comprising different etch depths, e.g. fully etched ridge waveguides or partially etched shoulders of a rib waveguide. For the latter the shoulders may be doped at a later stage so as to obtain a phase-shifter for instance. FIG. 6 is showing the substrate and buried oxide layer as well as the silicon or silicon nitride substrate layer. FIG. 7 shows the patterning of the silicon or silicon nitride substrate layer.

Figure 8:
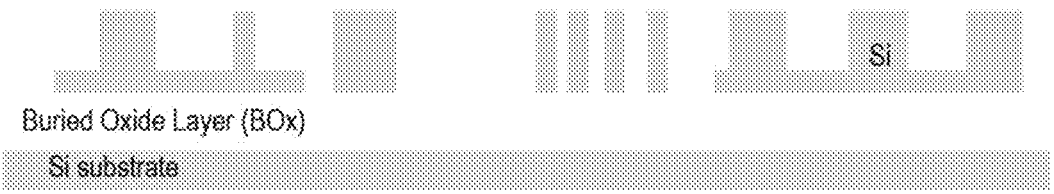
FIG. 8 illustrates a step in the production of a photonics system, according to example embodiments.
Figure 9:
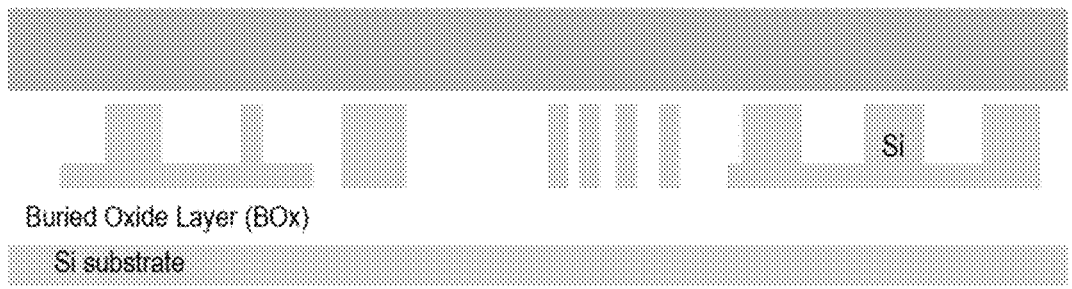
FIG. 9 illustrates a step in the production of a photonics system, according to example embodiments.
Figure 10:
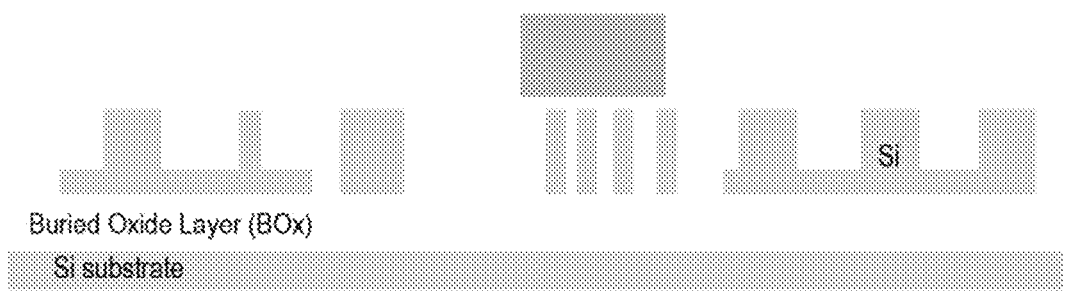
FIG. 10 illustrates a step in the production of a photonics system, according to example embodiments.

In a second step the remaining photosensitive material is removed and the etched parts of the patterned substrate layer are filled with silicon oxide or any other suitable isolating material and the resulting surface is planarized, e.g. by chemical-mechanical polishing, to a height level which coincides with the top level of the substrate layer. In some embodiments, the silicon oxide layer may in fact be overgrown and planarized, such that a smooth and planar covering silicon oxide layer remains on top of the patterned substrate layer. For such a particular embodiment, a silicon nitride layer may be deposited and annealed on top of the silicon oxide covering layer and subsequently patterned by lithography so as to define silicon nitride waveguides. FIG. 8 illustrates a silicon waveguide oxide planarization. FIG. 9 illustrates the optional step of deposition of the optional SiN layer whereafter the layer is annealed. In FIG. 10 the patterning of the SiN layer is shown, resulting in a SiN waveguide.

Figure 11:
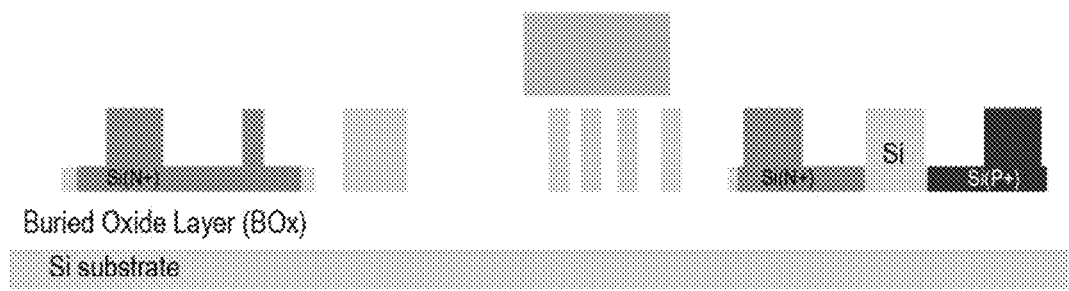
FIG. 11 illustrates a step in the production of a photonics system, according to example embodiments.

In a third step dopants are implanted locally into the well-defined regions of the waveguide structures that were patterned into the silicon substrate layer. The latter is illustrated in FIG. 11. The dopants may be donors or acceptor impurity species with the effect of locally changing the doping level and therefore locally modifying the majority carrier concentrations within the silicon waveguide regions. The implanted dopants may require a subsequent activation step, which for example is achieved through rapid thermal processing. In particular embodiments for instance, a phase-shifter or modulator may require a pn-junction or pin-junction type interface in order to achieve carrier injection or depletion into or out of a silicon waveguide core influencing thereby its absorption coefficient or refractive index. Such a junction may be formed by implanting dopants into a first and second shoulder of a silicon rib waveguide so as to obtain a first, n+ doped region, and a second p+ doped region adjacent to the silicon core region. In alternative embodiments additional rib-like structures may be patterned and doped, the rib-like structures being adjacent to a silicon rib waveguide and in contact with its shoulders.

In some embodiments, a lower contact fin of the final active, direct bandgap III-V semiconductor nanoridge waveguides may be a thin n+ doped silicon fin, e.g., between 20 nm to 100 nm wide, and patterned into the silicon substrate such that it does not reach the buried oxide layer underneath the silicon substrate layer. Instead such a n+ doped contact fin is defined on top of a thin, typically 100 nm high basis of residual n+ doped silicon, the residual n+ doped silicon being in contact with an adjacent n+ doped silicon rib structure at one side. The lower n+ doped silicon contact fin of the final active, direct bandgap III-V semiconductor nanoridge waveguides typically has heights in the range of 100 nm to 400 nm. In such an embodiment, the n+ doped silicon fin is adjacent, but not in electrical contact to a dopant-free silicon waveguide at the other side and separated by silicon oxide filled, typically 50 nm to 800 nm wide gap as measured between the center of the n+ doped fin and the closest outer edge of the dopant-free silicon ridge waveguide. In such an embodiment, the dopant-free silicon ridge waveguide is typically 100 nm to 1000 nm wide and 200 nm to 500 nm high, but other geometric shapes and dimensions may be selected for other purposes too.

In a fourth step a thin dielectric liner layer, e.g. a thin silicon oxide layer, is deposited on top of all the preceding layers.

Figure 12:
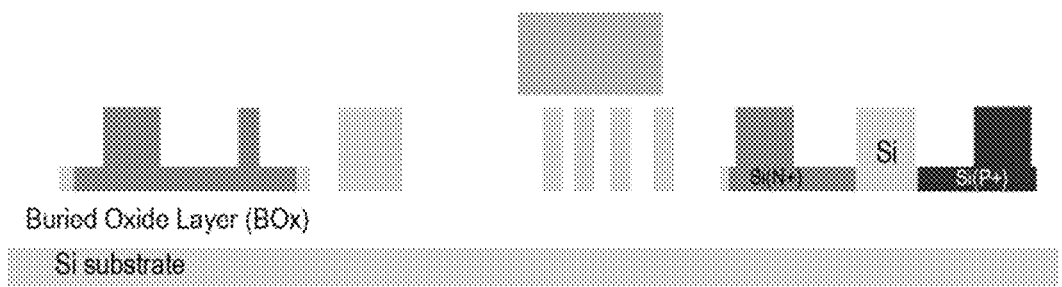
FIG. 12 illustrates a step in the production of a photonics system, according to example embodiments.

FIG. 12 illustrates deposition of an oxide liner.

Figure 13:
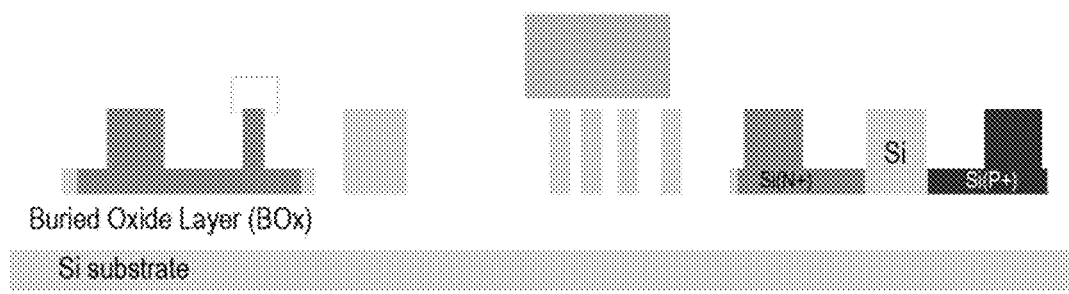
FIG. 13 illustrates a step in the production of a photonics system, according to example embodiments.

In a fifth step, recesses are formed locally into the thin silicon oxide liner layer removing completely the deposited silicon oxide liner layer in regions where the lower n+ doped silicon contact fins are located. Typically the width of the recess exceeds the width of the exposed lower n+ doped silicon contact fins. In FIG. 13 the creation of the local oxide recess is shown.

Figure 14:
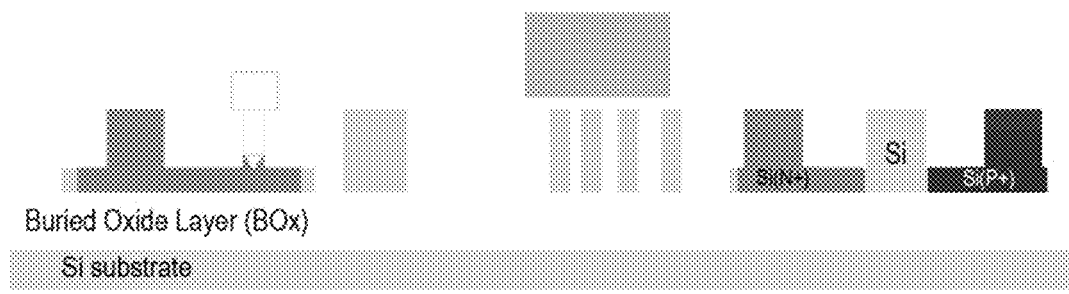
FIG. 14 illustrates a step in the production of a photonics system, according to example embodiments.

In a sixth step the so exposed n+ doped silicon contact fins of the previous step are anisotropically wet etched, e.g. by addition of the wet etchant tetramethylammonium hydroxide (TMAH). In FIG. 14 the application of a TMAH wet silicon fin recess etch is illustrated. In some embodiments, the choice of the wet etchant, the etchant's concentration and temperature can be controlled so as to achieve smooth, V-shaped etching of silicon seed surfaces having free {111} facets after the anisotropic wet etch step, which reduces defect formation and excludes the existence of antiphase domain formation upon epitaxial growth of III-V materials on those seeding silicon surfaces. In some embodiments, the tips of the V-shaped silicon surface pointing toward the substrate may be located at a height level that corresponds to the height of the top level of the residual n+ doped silicon substrate layer of the unetched, lower n+ doped silicon contact fins. In such embodiments, the thin trenches in the silicon oxide layer that form as result from the wet etch step have their depths maximized and enable high aspect ratios exceeding one, e.g., in the range from five to twenty-five. Such trenches of high aspect ratios may trap misfit and dislocation defects efficiently as soon as III-V materials are epitaxially grown inside them. The trench side walls may be angled in some embodiments.

Figure 15:
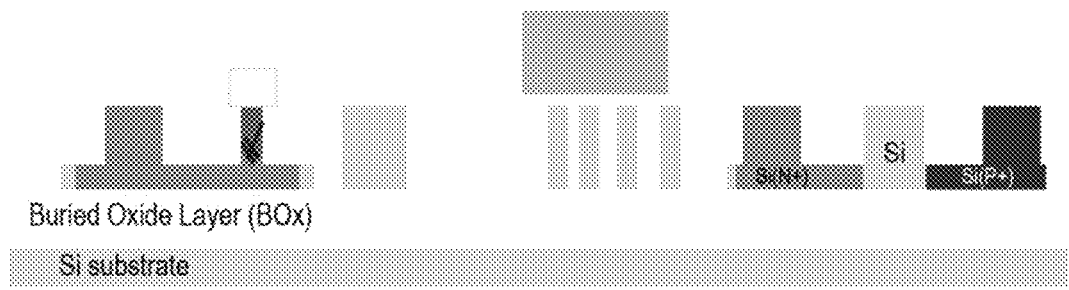
FIG. 15 illustrates a step in the production of a photonics system, according to example embodiments.

In a seventh step a bottom n+ doped, direct bandgap III-V material layer, e.g. n+ doped GaAs, is grown epitaxially inside the high aspect ratio trenches from which the n+ doped silicon was removed by an anisotropic wet etch in the previous step. The latter is shown in FIG. 15. Doping the III-V material layer will improve its contact properties as the n+ doped, direct bandgap III-V material layer epitaxially grown inside the narrow trenches is still forming the lower n+ doped contact fin of the final active, direct bandgap III-V nanoridge waveguide. In some embodiments, well-studied epitaxial deposition techniques, such as low pressure metal organic vapor phase epitaxy (MOVPE), may be used to grow the n+ doped, direct bandgap III-V material layer. In some embodiments, the fabrication process is well established and controlled based on obtained results for this advanced processing technique and does not require a high vacuum environment as needed by other epitaxy techniques, e.g. molecular beam epitaxy. Metal organic precursors like TMGa and TBAs may be introduced into a 300 mm MOVPE chamber operating at pressures in the range of 20-100 torr for this purpose, and molecular hydrogen gas may act as carrier gas. Furthermore, III-V materials, such as doped or intrinsic GaAs, InGaAs, InP, etc., may be used during this epitaxy step, even though there exists an important lattice mismatch between these III-V materials and silicon. In some embodiments, the problem of lattice mismatch and the related problems of misfits, threading dislocations, and planar defects are reduced since those misfits, defects, and dislocations are trapped at the trench sidewalls. The deeper and narrower the trenches are, that is the higher the aspect ratio of the trenches is, the better the chances to trap almost all the defects, misfits, and dislocations along the trench side walls. Moreover, in some embodiments, the direct bandgap III-V material layer is first seeded on V-shaped silicon surfaces whose facets are oriented {111} crystal planes; the growth on {111} silicon crystal planes excludes the formation of antiphase domain boundaries.

The epitaxial growth of the direct bandgap III-V material layer inside the narrow trenches, e.g. n+ doped GaAs, as described in the seventh step typically involves a sequence of several minor steps. In a first minor step, a closed and uniform seed layer of n+ doped GaAs is formed on the V-shaped {111} silicon crystal planes as a result of a low first temperature, 2D nucleation process typically taking place at 350° C.-450° C., e.g. at 360° C. In a second minor step, increasing first temperatures to second temperatures which may vary between 500° C.-650° C. lead to some reflow of the seed layer which, however, stays closed. In a third minor step, material overgrowth takes place at the high second temperatures and the narrow trenches are filled by the same or a different III-V material. In some embodiments, InGaAs may be grown on top of the GaAs seed layer and the overgrowth may extend beyond the top level of the narrow trenches.

Figure 16:
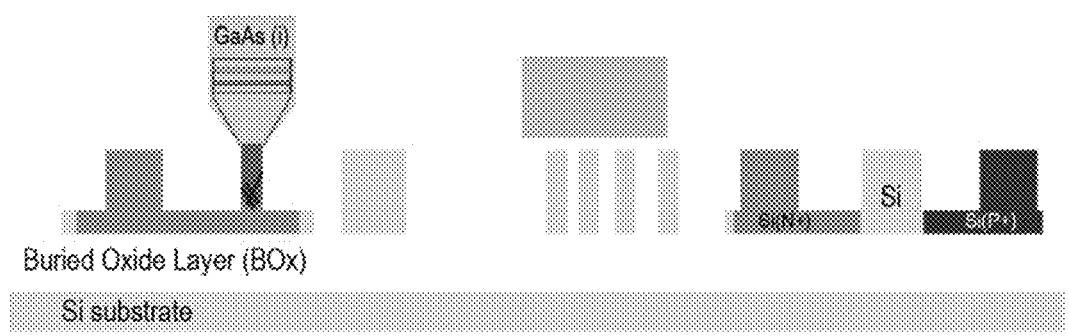
FIG. 16 illustrates a step in the production of a photonics system, according to example embodiments.

In an eighth step, one or more III-V materials are overgrown on top of the trench filling III-V material, the growth temperatures depending on the selected III-V materials during the overgrowth. This overgrowth starts at the upper level of the narrow trenches where the recess in the silicon oxide liner layer may be wider than the trench itself. In some embodiments, intrinsic GaAs may be grown on top of the trench filling, n+ doped GaAs lower contact fin, so as to form the body portion of the final active III-V nanoridge waveguide. In some embodiments, the overgrown III-V material, e.g. the GaAs box-like portion, is completely relaxed and has free-standing lattice constants, which facilitates its use as buffer for the integration of hetero-layers, e.g. multiple stacked quantum well structures. This is shown in FIG. 16. Moreover, in some embodiments, various shapes of the overgrown III-V material can be obtained depending on the selected process parameters, such as growth temperature, partial pressure of the precursors, III/V ratio of the precursors, reactor pressure, pattern mask ratio, selective area growth rate, growth rates of different III-V compositions and of their respective crystal planes, etc. Shapes may be of triangular, box-like, diamond-like, or ridge-like cross-section with a hat-like or a flat top surface. For instance the upwards directed Ga-rich {111} surface of a GaAs III-V material may be subject to growth conditions favoring this surface over other surfaces, e.g. the downwards directed As-rich {111} layer, the {001} top layer, and the {110} side layers; these growth conditions lead to quickly forming flat top surfaces and a box-like shapes. The box-like shapes with flat top surfaces may be used for the fabrication of the active III-V nanoridge waveguides as they allow for increased III/V volume, efficient modal gain, and waveguiding action outside the contact forming trenches of the nanoridge waveguide. In some embodiments, such a GaAs box-like nanoridge waveguide body portion may be 200 nm to 600 nm wide and 200 nm to 600 nm high as measured from the top end of the supporting lower contact fin. In some embodiments, the eighth step may also include the integration of multiple hetero-junction layers, e.g. very uniform, surface-flat In(0.2)Ga(0.8)As/GaAs multi-quantum well stacks, on the flat intrinsic GaAs buffer during overgrowth. In such particular embodiments, the multi-quantum well stacks form the active gain region for a guided optical mode inside the nanoridge waveguide, thus allowing for lasing operation of a laser diode.

Figure 17:
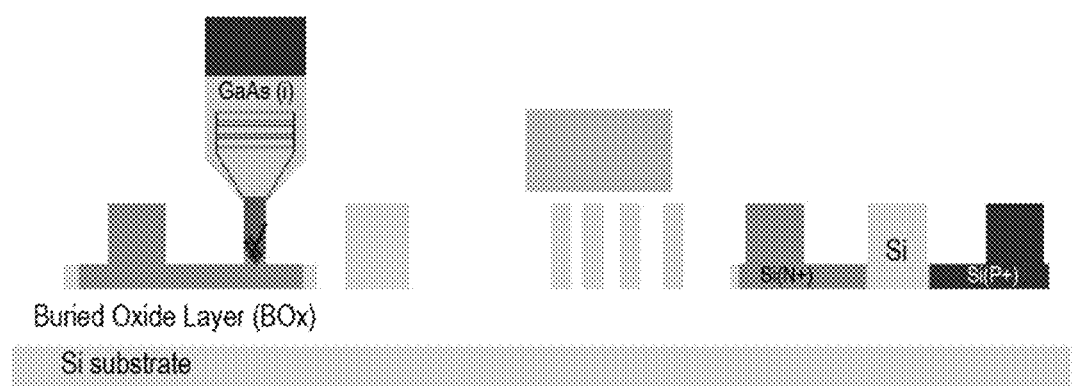
FIG. 17 illustrates a step in the production of a photonics system, according to example embodiments.

In a ninth step, one or more p-doped III-V material layers, e.g. p-type and p+-type GaAs, are deposited by epitaxial growth on top of the overgrown nanoridge waveguide body portion, which may comprise multi-quantum well stack embedded into it. The latter is shown in FIG. 17. In some embodiments, these doped III-V layers serve as upper contact fins to the active III-V direct bandgap nanoridge waveguides after a subsequent patterning step and may be 100 nm to 500 nm high.

Figure 18:
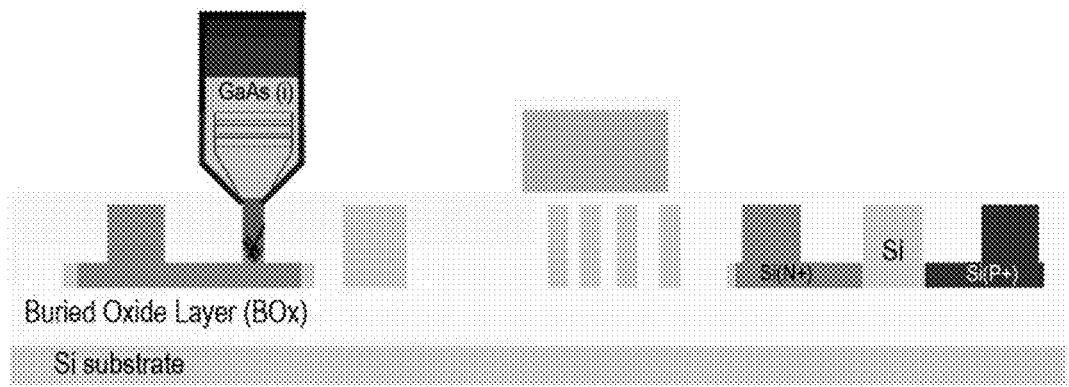
FIG. 18 illustrates a step in the production of a photonics system, according to example embodiments.

In a tenth step, a III-V material based passivation cap, for instance InGaP with about 51% In content that is lattice matched to the intrinsic GaAs and grown at about 625° C., may be 20 nm to 70 nm thick and wrapped entirely around the overgrown, free-standing body portion of the active III-V nanoridge waveguide. The latter is shown in FIG. 18. In some embodiments, such an encapsulating passivation layer may enhance carrier confinement under electrical pumping and reduces non-radiative surface recombination effects.

Figure 19:
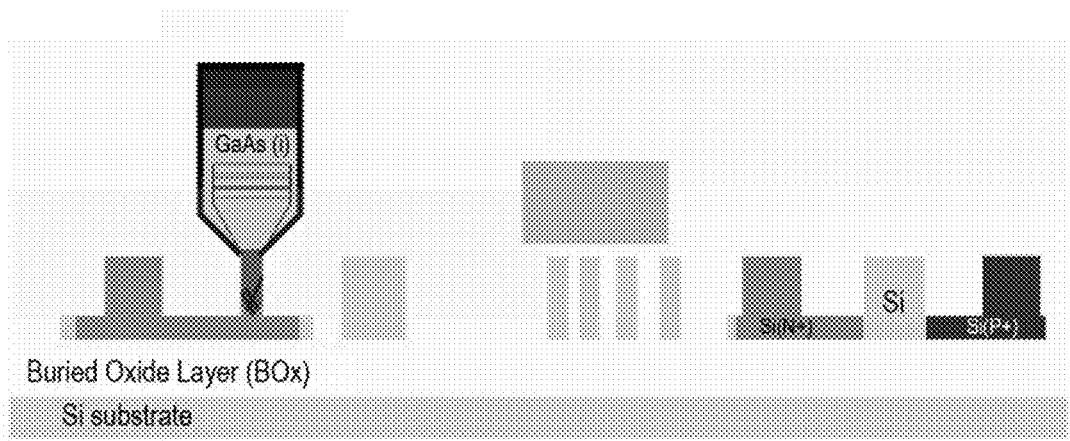
FIG. 19 illustrates a step in the production of a photonics system, according to example embodiments.
Figure 20:
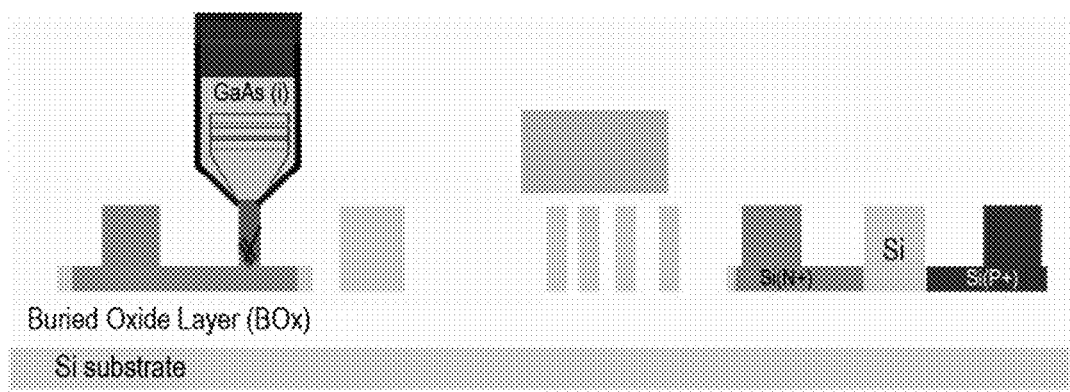
FIG. 20 illustrates a step in the production of a photonics system, according to example embodiments.

In an eleventh step, a pre-metal dielectric layer, e.g. a silicon oxide layer is deposited onto the entire area covering all the structures obtained in previous steps. The latter is shown in FIG. 19.

Figure 21:
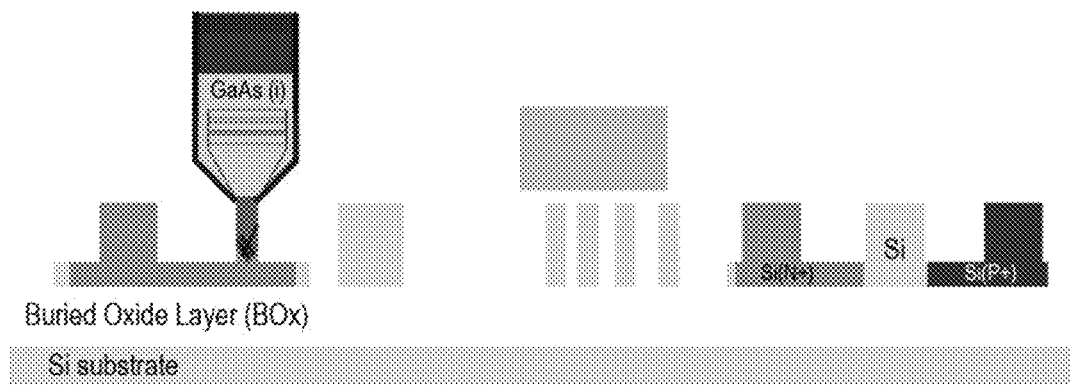
FIG. 21 illustrates a step in the production of a photonics system, according to example embodiments.

In a twelfth step, the pre-metal dielectric layer of the previous step is planarized, e.g. by chemical-mechanical polishing, and etched back to the level of the top surface of the nanoridge III-V passivation layer. The latter is shown in FIG. 21.

Figure 22:
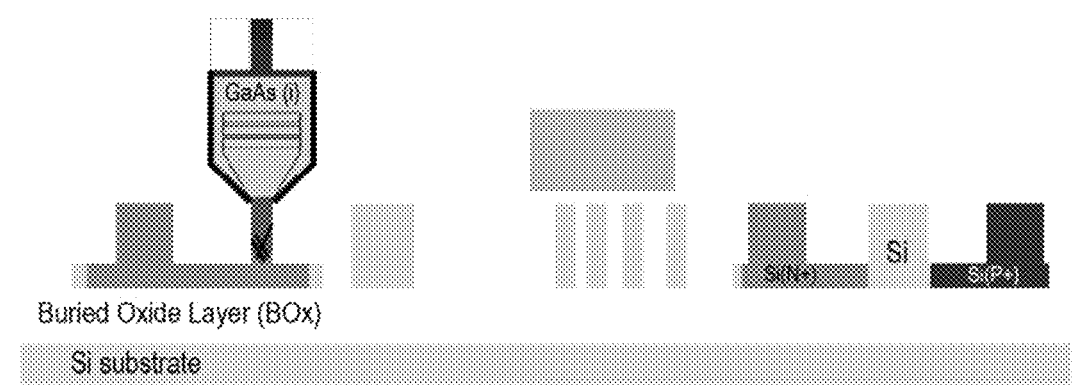
FIG. 22 illustrates a step in the production of a photonics system, according to example embodiments.

In a thirteenth step, the top III-V passivation layer of the active direct bandgap III-V material nanoridge waveguide is removed, e.g. through etching, as shown in FIG. 22.

Figure 23:
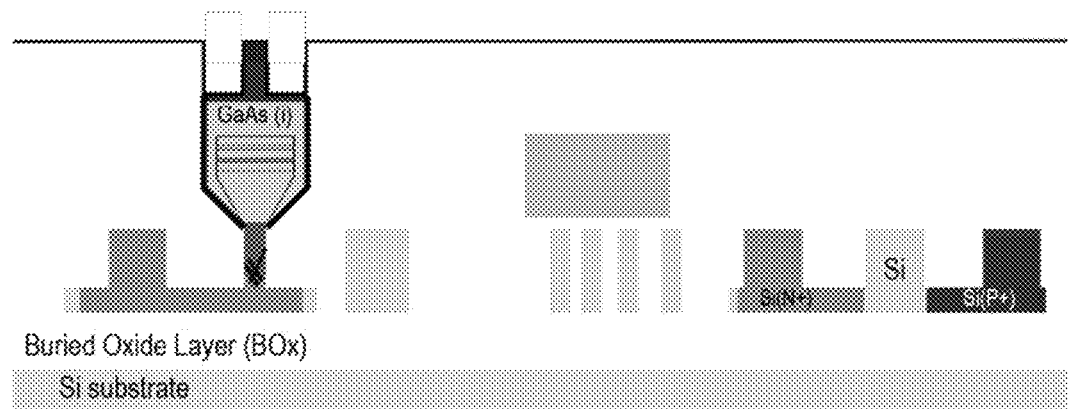
FIG. 23 illustrates a step in the production of a photonics system, according to example embodiments.
Figure 24:
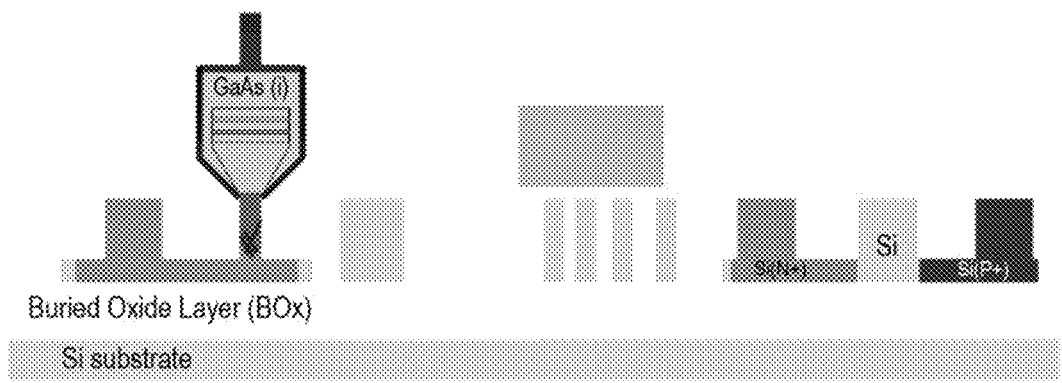
FIG. 24 illustrates a step in the production of a photonics system, according to example embodiments.

In a fourteenth step, the one or more p-doped III-V material layers of the ninth step, e.g. the p-type and p+-type GaAs layers, are selectively etched to form narrow top contact fins to the active III-V material nanoridge waveguides. The top contact fins may have widths of 20 nm to 100 nm. In some embodiments, an additional top passivation layer may be applied to the current material stack. The latter is shown in FIG. 23 and FIG. 24.

In a fifteenth step, again a pre-metal dielectric layer is deposited on top of the current material stack, followed by a planarization process.

Figure 25:
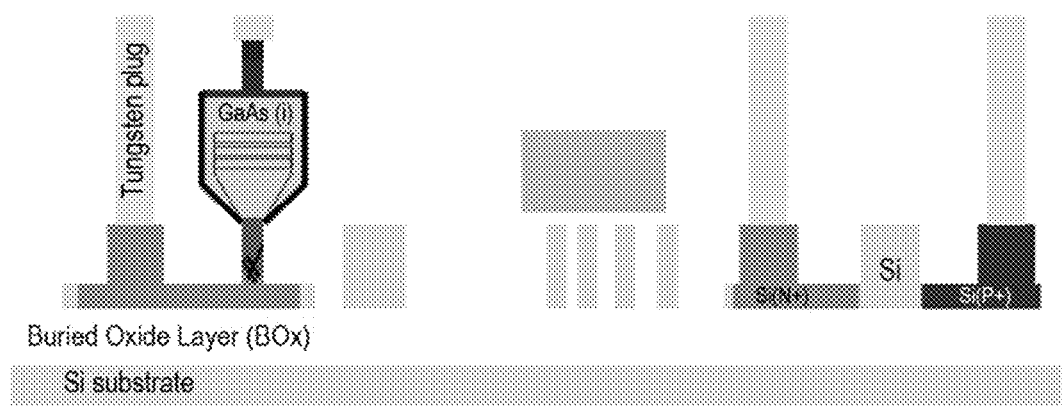
FIG. 25 illustrates a step in the production of a photonics system, according to example embodiments.

In a sixteenth step, contact plugs, e.g. tungsten contact plugs, are formed on defined regions of the patterned and doped silicon substrate layer of step three and the top contact fin of the fourteenth step by selectively removing the pre-metal dielectric layer of the previous step and selectively depositing the contact metal inside the resulting gaps. The latter is shown in FIG. 25. In some embodiments, this step ensures electrical contacting of the active nanoridge devices as well as the possible active silicon devices mentioned in step three.

Figure 26:
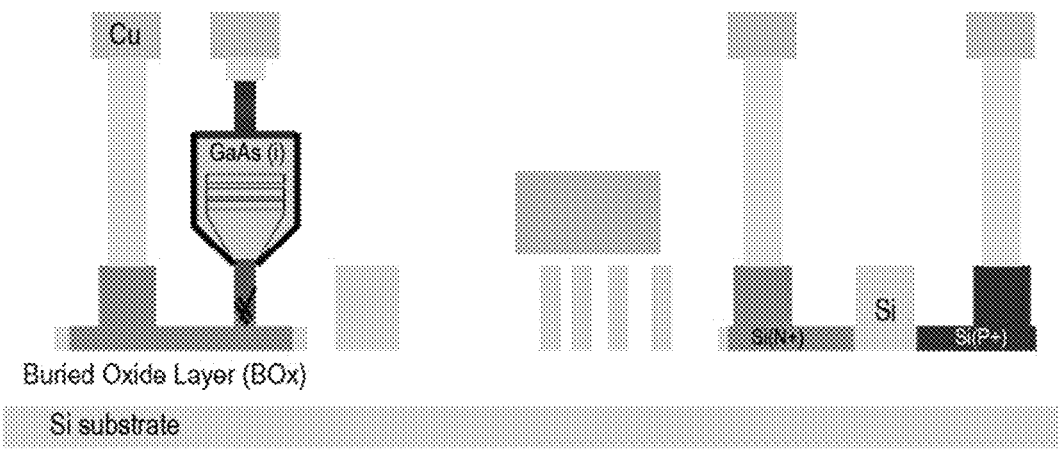
FIG. 26 illustrates a step in the production of a photonics system, according to example embodiments.
Figure 27:
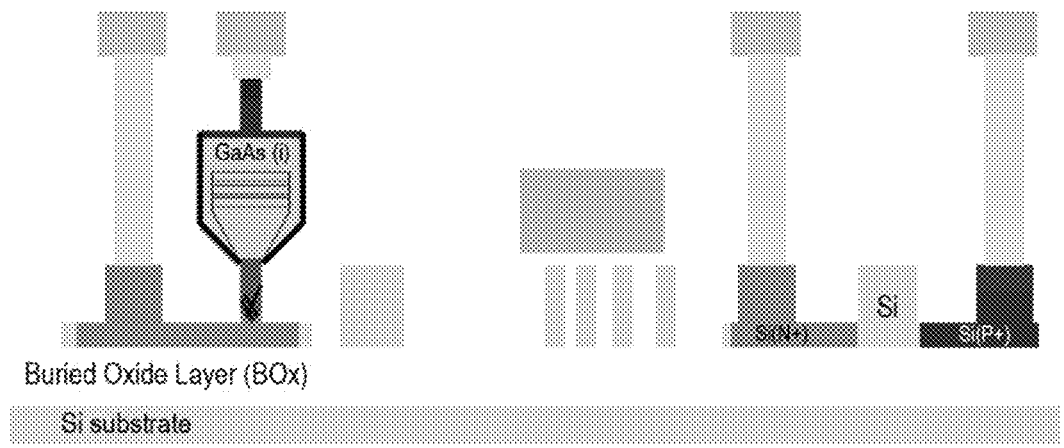
FIG. 27 illustrates an overview of a photonics system obtained through a method according to example embodiments.

In a seventeenth step, metal interconnects, e.g. copper damascene pads, are provided to the material stack in regions where the contact plugs exist, by first selectively patterning an underlying insulating oxide layer, then applying an overfilling metallization layer, and finally removing the excess metal by planarization, e.g. chemical-mechanical planarization. The latter is illustrated in FIG. 26. In FIG. 27, the final cross section is shown.

By way of illustration, embodiments not being limited thereby, some simulations results are further discussed, illustrating features of systems according to embodiments.

Figure 28:
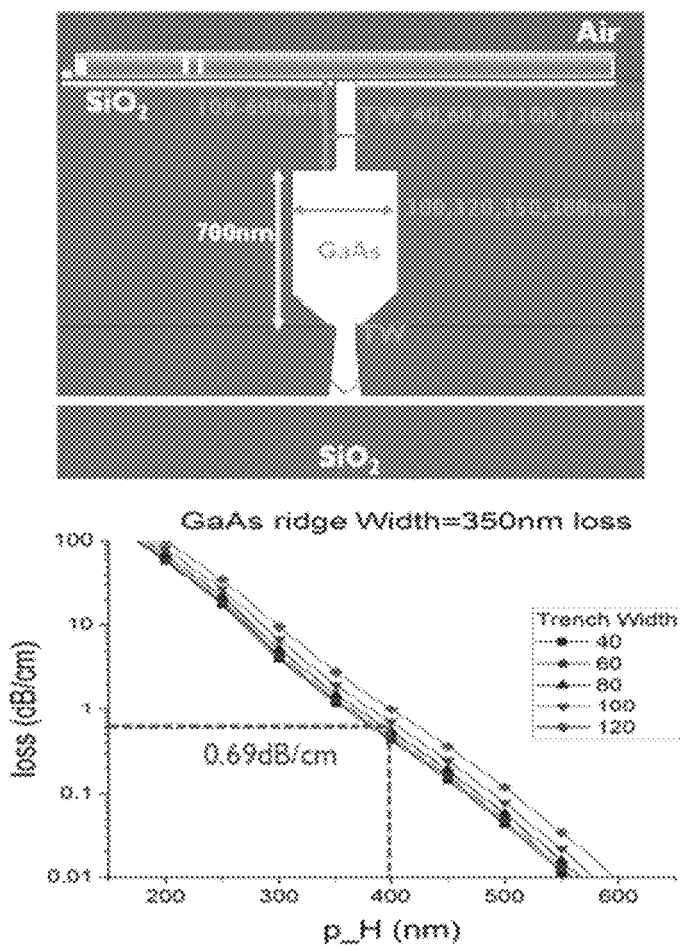
FIG. 28 illustrates, in the graph at the bottom, simulation of the optical loss induced by the metal electrodes as function of device parameters for a device (shown at the top), according to example embodiments.

FIG. 28 illustrates the optical mode loss induced by Ti metal electrodes in a device according to example embodiments. At the top the layout of the device is shown, whereas at the bottom the loss is shown as function of varying trench height of the p-doped region between 100 nm and 600 nm for varying trench width between 40 nm and 120 nm. It can be seen that an optical loss smaller than 1 dB/cm can be achieved.

Figure 29:
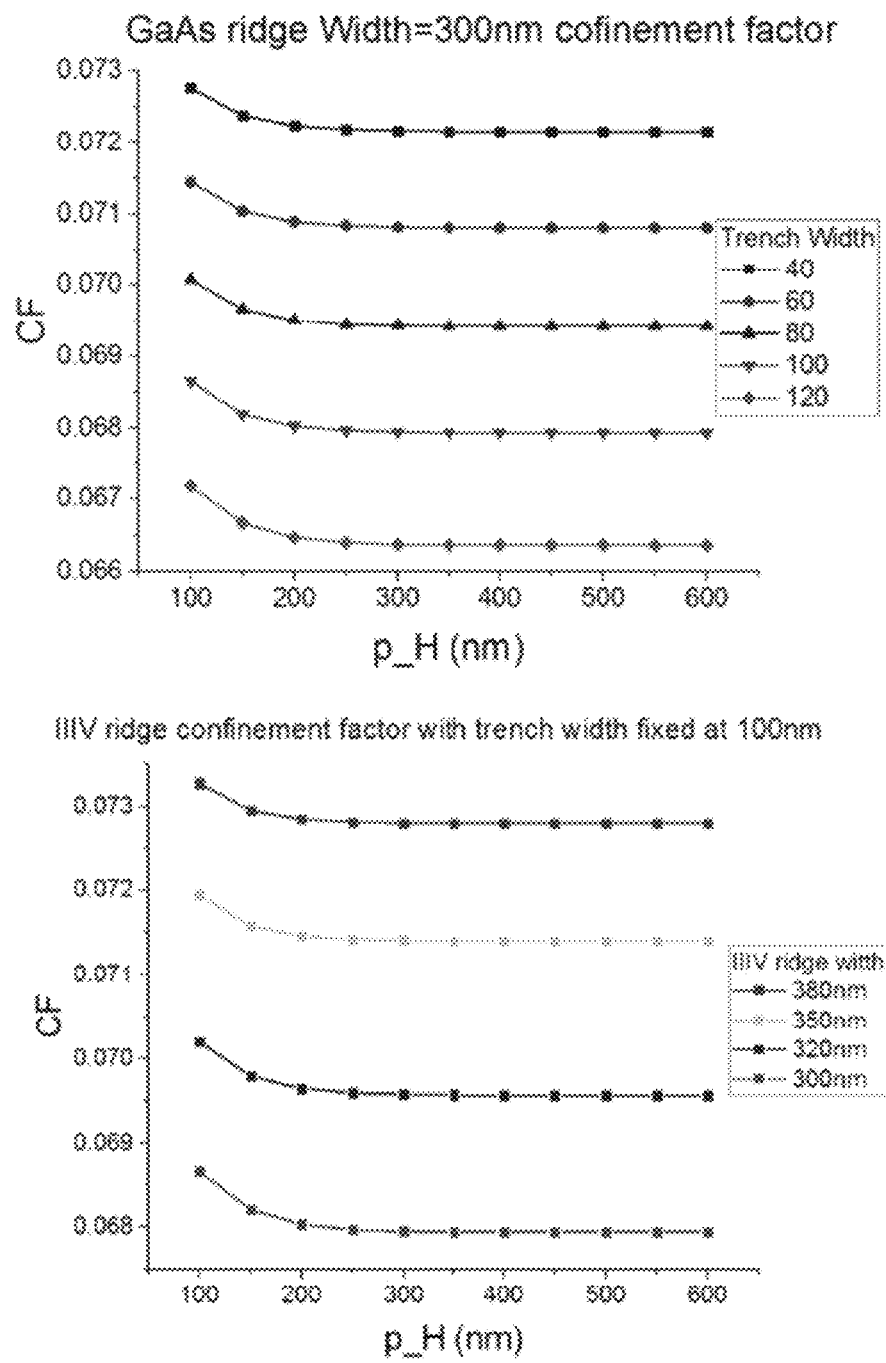
FIG. 29 illustrates the simulated confinement factor in an active layer for two configurations, according to example embodiments.

FIG. 29 illustrates the optical confinement in an active layer comprising three quantum wells for a device according to example embodiments. In the device, it is assumed that there are three quantum wells, that the thickness of the active layer is 10 nm, that the barrier gap is 55 nm and that the material is GaAs. In the upper graph of FIG. 29 the confinement factor for a GaAs ridge with a width of 300 nm is shown for different trench widths (varying from 40 nm to 120 nm), whereas in the lower graph the III-V ridge confinement factor with a trench width fixed at 100 nm is shown. It can be seen that wider III-V ridges with narrower trenches have (slightly) higher confinement factors and lower loss.

Further the optical coupling between the silicon waveguide and III-V waveguide was simulated and was found to approach 100% for a gap of 130 nm. A coupling length of 50 μm was reached with a gap of 280 nm. Similarly, the optical coupling between two silicon waveguides and a III-V waveguide was illustrated and found to be 50% to each individual silicon waveguide and 100 to both waveguides. This double symmetric silicon waveguide setup reduced the coupling length compared to the single waveguide embodiment.

While the invention has been illustrated and described in detail in the drawings and foregoing description, such illustration and description are to be considered illustrative or as examples and not restrictive. The foregoing description details certain embodiments of the invention. It will be appreciated, however, that no matter how detailed the foregoing appears in text, the invention may be practiced in many ways. The invention is not limited to the disclosed embodiments.

What is claimed is:

1. A monolithic integrated active/passive waveguide photonic system, the system comprising:
   a substrate having positioned thereon at least one active waveguide, at least one passive waveguide, and at least one radiation coupler between the at least one active waveguide and the at least one passive waveguide,
   wherein the at least one active waveguide and the at least one passive waveguide are monolithically integrated and are arranged for evanescent wave coupling between the waveguides,
   wherein the at least one active waveguide comprises a freestanding body portion and a supporting bottom fin portion,
   wherein the freestanding body portion is characterized by part of the at least one active waveguide growing out vertically and laterally from the supporting bottom fin portion of the at least one active waveguide,
   wherein the supporting bottom fin portion is in contact with the substrate,
   wherein the passive waveguide is offset vertically towards the substrate with respect to the freestanding body portion of the active waveguide, and
   wherein the at least one active waveguide and the at least one passive waveguide are positioned so that no portion of the at least one active waveguide overlaps any portion of the at least one passive waveguide in both a height direction and a lateral direction with respect to the substrate.

2. The system according to claim 1, wherein the at least one active waveguide comprises a III-V waveguide or the at least one passive waveguide comprises a silicon waveguide or a silicon nitride waveguide.

3. The system according to claim 1, wherein the at least one active waveguide comprises a III-V semiconductor nanoridge waveguide.

4. The system according to claim 3, wherein the at least one radiation coupler is configured to couple radiation between the at least one active waveguide and the at least one passive waveguide, and wherein the at least one radiation coupler is configured to couple radiation such that radiation does not travel in edge portions of the III-V semiconductor nanoridge waveguide.

5. The system according to claim 1, further comprising contacts for the at least one active waveguide, wherein the contacts comprise:
   a bottom n-type contact fin comprising n+ implanted silicon and a top p-type contact comprising an in-situ, p+-doped, low-bandgap, III-V semiconductor fin; or
   a bottom p-type contact and a top n-type contact.

6. The system according to claim 1, further comprising a semiconductor optical amplifier, a laser diode, an electroabsorption modulator, a photodetector, or an optical transceiver.

7. The system according to claim 1, wherein the passive waveguide comprises Si, Ge, or GeSi.

8. The system according to claim 1, wherein portions of the waveguides between which the evanescent wave coupling occurs are portions of the waveguides where the waveguides are parallel to each other.

9. The system according to claim 1, wherein the active waveguide comprises: (i) a GaAs waveguide with InGaAs quantum wells, InAs and InGaAs quantum dots, InGaAs/GaSbAs transitions, or InGaNAs quantum wells; (ii) an InP waveguide with InGaAs quantum wells, InGaAsP quantum wells, InAs quantum dots, or AlGaInAs quantum wells; (iii) an InAs waveguide with InGaSbAs quantum wells; or (iv) a GaSb waveguide with InGaSbAs quantum wells.

10. A method for manufacturing a monolithic integrated active/passive waveguide photonic system, the method comprising:
    providing a substrate; and
    monolithically integrating, on the substrate, an active waveguide and a passive waveguide,
    wherein monolithically integrating comprises integrating the active waveguide and the passive waveguide such that evanescent wave coupling between the active waveguide and the passive waveguide is obtained, and
    wherein the active waveguide and the passive waveguide are monolithically integrated such that the active waveguide and the passive waveguide are positioned so that no portion of the active waveguide overlaps any portion of the passive waveguide in both a height direction and a lateral direction with respect to the substrate.

11. The method according to claim 10, wherein the active waveguide comprises a III-V semiconductor waveguide or the passive waveguide comprises a silicon or a silicon nitride waveguide.

12. The method according to claim 10,
    wherein the active waveguide and the passive waveguide are monolithically integrated from an active III-V nanoridge waveguide and a passive Si photonic structure,
    wherein the active III-V nanoridge waveguide comprises a freestanding body portion and a supporting bottom fin portion,
    wherein the freestanding body portion is characterized by part of the active III-V nanoridge waveguide growing out vertically and laterally from the supporting bottom fin portion of the active III-V nanoridge waveguide,
    wherein the supporting bottom fin portion is in contact with the substrate,
    wherein monolithically integrating comprises providing a radiation coupler between the active III-V nanoridge waveguide and the passive Si photonic structure, and
    wherein the passive Si photonic structure is offset vertically towards the substrate with respect to the freestanding body portion of the active III-V nanoridge waveguide.

13. The method according to claim 12, wherein the active III-V nanoridge waveguide comprises at least one heterojunction forming a quantum well or quantum dot inside an active region of the one active III-V nanoridge waveguide.

14. The method according to claim 13, wherein:
    the active III-V nanoridge waveguide is made from GaAs and the quantum well is made from InGaAs;
    the active III-V nanoridge waveguide is grown on a patterned silicon substrate; or
    the active III-V nanoridge waveguide is grown monolithically in a narrow trench with a width ranging from 20 nm to 500 nm and with a height ranging from 100 nm to 500 nm.

15. The method according to claim 14, wherein:
    the active III-V nanoridge waveguide was seeded on a {111} facet of a V-shaped Si surface;

the active III-V nanoridge waveguide was grown by metalorganic vapor-phase epitaxy, molecular-beam epitaxy, or hybrid vapor-phase epitaxy; or the freestanding body portion of the active III-V nanoridge waveguide is passivated by a wrapping layer.

16. The method according to claim 12, wherein the active III-V nanoridge waveguide comprises:

an n+-doped, Si fin as a bottom contact and a p+-doped, low-bandgap, III-V contact fin attached to its top surface; or a p+doped bottom contact and an n+ top contact.

17. The method according to claim 12, wherein the radiation coupler is configured to couple radiation between the active III-V nanoridge waveguide and the passive Si photonic structure, and wherein the radiation coupler comprises at least one phase-matched evanescent coupler.

18. The method according to claim 17, wherein:

the at least one phase-matched evanescent coupler has a length and a gap that together maximize an amount of coupled radiation; or the at least one phase-matched evanescent coupler is placed in such a way as to have substantially no light propagation in end portions of the active III-V nanoridge waveguide.

19. The method according to claim 10, wherein the passive waveguide comprises Si, Ge, or GeSi, and wherein the active waveguide comprises: (i) a GaAs waveguide with InGaAs quantum wells, InAs and InGaAs quantum dots, InGaAs/GaSbAs transitions, or InGaNAs quantum wells; (ii) an InP waveguide with InGaAs quantum wells, InGaAsP quantum wells, InAs quantum dots, or AlGaInAs quantum wells; (iii) an InAs waveguide with InGaSbAs quantum wells; or (iv) a GaSb waveguide with InGaSbAs quantum wells.

20. The method according to claim 10, wherein portions of the waveguides between which the evanescent wave coupling occurs are portions of the waveguides where the waveguides are parallel to each other.

* * * * *